United States Patent [19]

Ogita

[11] 4,403,113
[45] Sep. 6, 1983

[54] CIRCUIT FOR CANCELLING SINUSOIDAL PILOT SIGNAL CONTAINED IN COMPOSITE SIGNAL

[75] Inventor: Minoru Ogita, Hamamatsu, Japan

[73] Assignee: Nippon Gakki Seizo Kabushiki Kaisha, Hamamatsu, Japan

[21] Appl. No.: 324,604

[22] Filed: Nov. 24, 1981

[30] Foreign Application Priority Data

Dec. 1, 1980 [JP] Japan ................. 55-170101

[51] Int. Cl.³ .............. H04H 5/00; H03B 19/00
[52] U.S. Cl. ................ 179/1 GC; 179/1 GE; 328/14; 329/124
[58] Field of Search ......... 179/1 GB, 1 GC, 1 GD, 179/1 GN, 1 GM, 1 P, 1 GE; 363/43, 148, 156; 328/14, 162, 165; 329/122, 123, 124

[56] References Cited

U.S. PATENT DOCUMENTS

| 1,691,986 | 11/1928 | Nyquist ................. 363/43 |
| 4,047,116 | 9/1977 | Ogita .................. 179/1 GD X |
| 4,069,398 | 1/1978 | Fujie ................... 179/1 GE |
| 4,076,963 | 2/1978 | Fujie et al. ............ 179/1 GD |

4,366,470 12/1982 Takanashi et al. ............. 328/14 X

Primary Examiner—R. J. Hickey
Attorney, Agent, or Firm—Oblon, Fisher, Spivak, McClelland & Maier

[57] ABSTRACT

A DC voltage having a magnitude proportional to the amplitude of a pilot signal in a composite signal which is employed in the commercial FM stereo broadcasting is generated and divided to plural voltage levels through a resistor voltage dividing network having a plurality of outputs. The output voltages of the voltage dividing circuit network are reciprocatingly multiplexed to a common terminal over a multiplexing cycle in response to the pilot signal. A sinusoidal-wavelike staircase waveform signal having a fundamental frequency the same as the frequency of pilot signal is taken out of the common terminal by appropriately setting values of resistors in the voltage dividing circuit network. The sinusoidal-wavelike staircase waveform signal is smoothed to generate a sinusoidal cancel signal which is then combined with the composite signal to cancel out the pilot signal in the composite signal.

5 Claims, 5 Drawing Figures

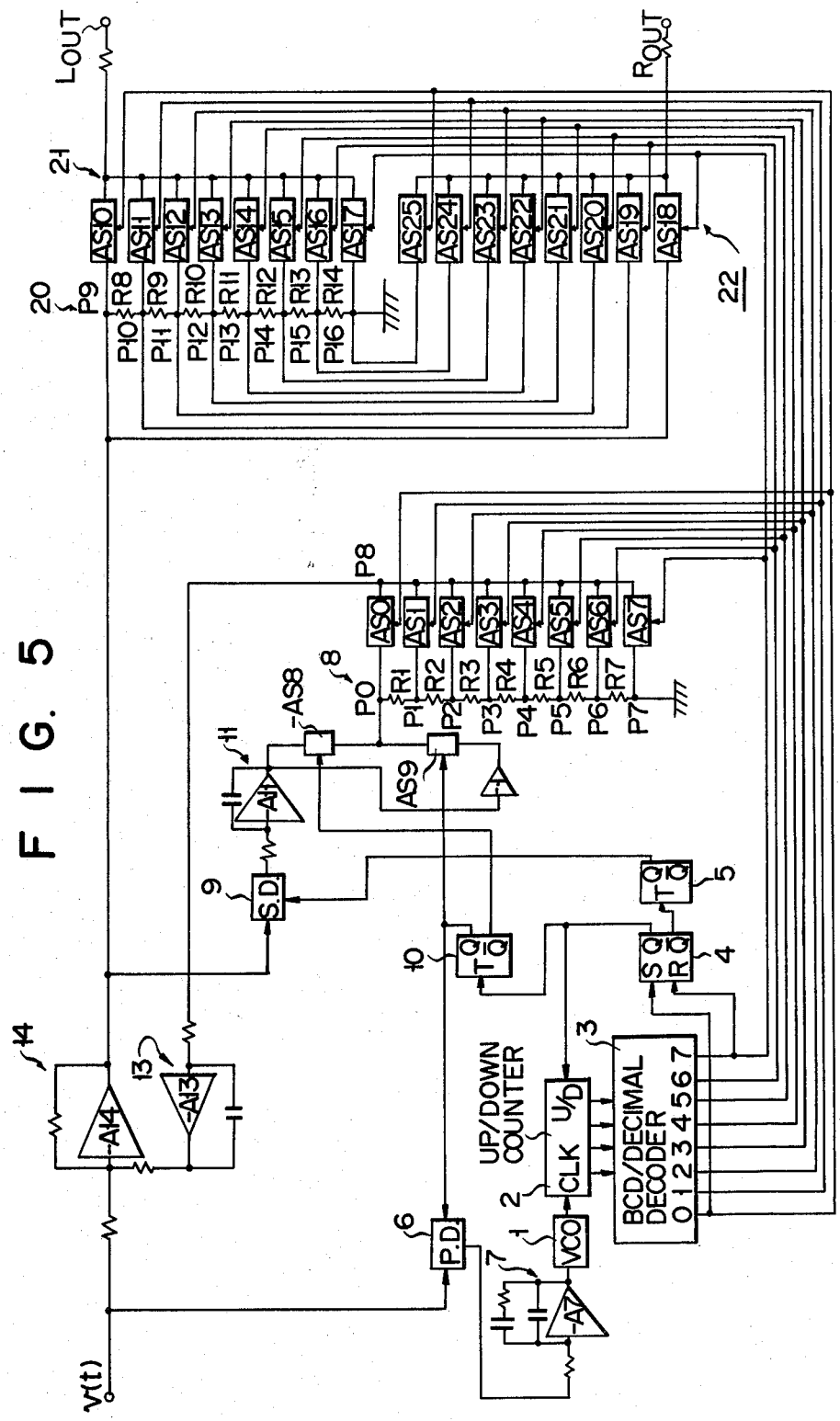
F I G. 5

CIRCUIT FOR CANCELLING SINUSOIDAL PILOT SIGNAL CONTAINED IN COMPOSITE SIGNAL

BACKGROUND OF THE INVENTION

The present invention relates to a pilot signal cancelling circuit suitable for use in a multiplex transmission system in which a sinusoidal wave is employed as a pilot signal.

In the commercial FM stereo broadcasting, as well known, a sinusoidal pilot signal of 19 KHz is contained in a FM stereo composite signal to assist a synchronous de-modulation. This pilot signal is used to generate a subcarrier-frequency switching signal necessary to carry out stereo demodulation on the side of receiver. This pilot signal is not necessary, however, on the output side of a stereo demodulating circuit which serves to recover left and right audio information signals from the FM stereo composite signal. This is the reason why a pilot signal cancelling circuit for removing the pilot signal from the composite signal is provided before the stereo demodulating circuit.

The pilot signal cancelling circuit is arranged to generate a cancel signal on the basis of the pilot signal contained in the FM stereo composite signal, which is 180° out of phase with the pilot signal, and to combine the cancel signal with the composite signal to cancel the pilot signal. A conventional pilot signal cancelling circuit employs an LC resonant circuit to generate a sinusoidal cancel signal. Inductance and capacitance elements in the LC resonant circuit are subject to variation with temperature and/or time and must be readjusted accordingly. In addition, the change of resonance characteristic often causes the phase of cancel signal to be shifted, thus deteriorating the stability of cancel signal.

SUMMARY OF THE INVENTION

An object of the present invention is to provide an improved pilot-signal cancelling circuit capable of generating a sinusoidal cancel signal without using an LC resonant circuit to cancel a pilot signal contained in composite signal.

According to the present invention, a DC voltage having a magnitude proportional to the amplitude of the pilot signal in the composite signal is generated by a pilot signal-to-DC voltage converting circuit and applied to a staircase-wave signal generating circuit to generate a sinusoidal-wavelike staircase signal which has the same frequency as, but is 180° out of phase with the pilot signal. The sinusoidal-wavelike staircase signal is applied to a smoothing circuit to generate a sinusoidal-wave cancel signal. This cancel signal is combined with the composite signal to cancel the pilot signal contained in the composite signal.

The staircase-wave signal generating circuit includes a voltage dividing circuit network to which the DC voltage having a magnitude proportional to the amplitude of pilot signal is applied and which has a plurality of outputs, and an analog multiplexer responsive to the pilot signal to reciprocatingly multiplex the outputs of the voltage dividing circuit network over one multiplexing cycle.

The DC voltage may be a rectangular wave signal having the frequency of pilot signal and a duty ratio of 50%, and the outputs of the voltage dividing circuit network are reciprocatingly multiplexed in this case over one cycle of a subcarrier having a frequency two times that of the pilot signal.

With the pilot signal cancelling circuit according to the present invention an LC resonant circuit is not used. Therefore, the sinusoidal cancel signal can be stably formed and the adjustment of the circuit becomes unnecessary.

BRIEF DESCRIPTION OF THE DRAWINGS

FIG. 5 shows a further example of pilot signal cancelling circuit according to the present invention.

DETAILED DESCRIPTION OF THE PREFERRED EMBODIMENTS

Figure 1:
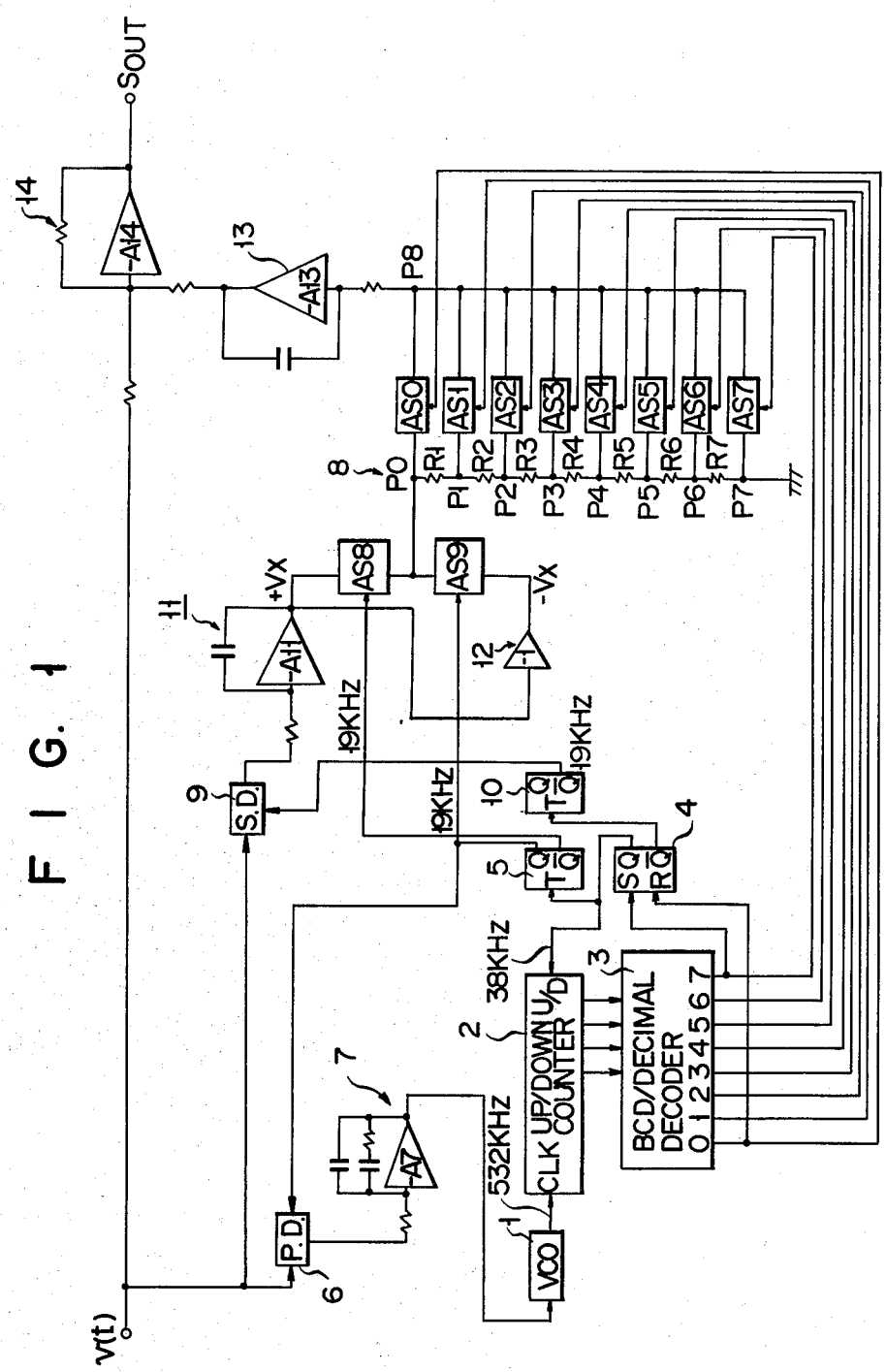
FIG. 1 shows an example of pilot signal cancelling circuit according to the present invention.
Figure 2:
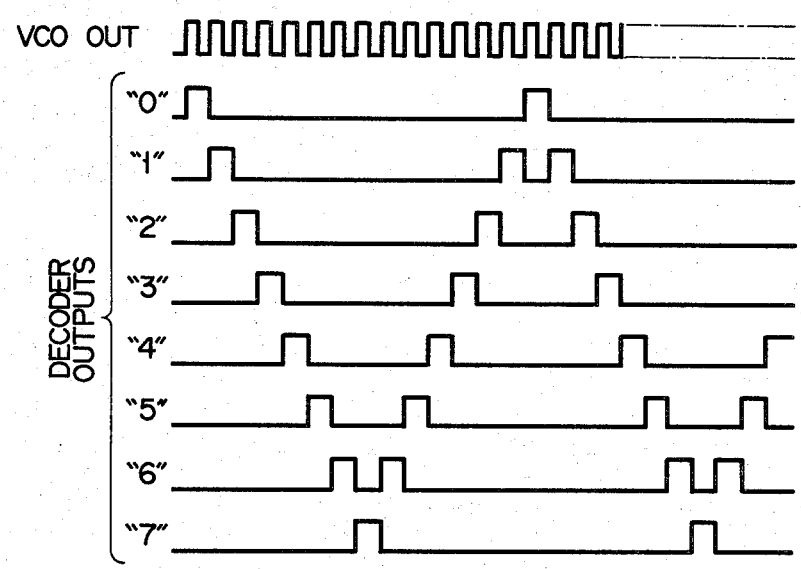
FIG. 2 shows waveforms of signals appearing at outputs of VCO and BCD/decimal decoder shown in FIG. 1.

Referring to FIG. 1 there is shown a pilot signal cancelling circuit according to the present invention which is arranged to remove a pilot signal from an FM stereo composite signal including a sum component (L+R) of left and right audio information signals, a (L−R) subcarrier component generated by suppressed-carrier amplitude-modulating a subcarrier of 38 KHz with the difference (L−R) of left and right audio information signals, and the pilot signal of 19 KHz.

Reference numeral 1 represents a voltage-controlled oscillator (VCO) whose frequency is locked to 532 KHz (38 KHz×14) synchronized with the pilot signal in composite signal v (t) by means of a PLL circuit including an up-down counter 2, BCD/decimal decoder 3, RS flip-flop 4, T flip-flop 5, phase comparator (PD) 6 and low-pass filter 7.

The up-down counter 2 counts rectangular clock pulses of 532 KHz from VCO 1 and provides an output in the form of binary-coded decimal (BCD) code. The BCD/decimal decoder 3 decodes an BCD code of output of up-down counter 2 to one of decimal numbers "0" to "7". The RS flip-flop 4 is set by the output "7" of decoder 3 and reset by the output "0" thereof. The counting direction of up-down counter 2 is changed over by the output Q of RS flip-flop 4. Therefore, positive-going pulses appear reciprocatingly and successively at the output terminals "0" to "7" of decoder 3 over one cycle period (1/38 msec) of subcarrier. The output frequency of RS flip-flop 4 is 38 KHz and that of T flip-flop 5 is therefore 19 KHz. The output signal of T flip-flop 5 is compared in phase with the pilot signal in the composite signal by phase comparator 6.

The sequential output pulses of decoder 3 are supplied to control inputs of analog switches $AS_0$–$AS_7$ having their signal inputs connected respectively to nodes $P_0$ to $P_7$ of resistors $R_1$ to $R_7$ and their outputs connected together to a circuit point $P_8$. The resistors $R_1$ to $R_7$ forms a voltage dividing circuit network 8.

The composite signal v (t) is detected, in a synchronous detector 9, with a rectangular wave signal of 19 KHz synchronized with the pilot signal and generated by a T flip-flop 10 which is connected to the output $\overline{Q}$ of RS flip-flop 4, and a synchronous detect output is converted by a low-pass filter 11 to a DC voltage $V_x$ having a magnitude proportional to the amplitude of pilot signal. This DC voltage $V_x$ is coupled to one end $P_0$ of voltage dividing circuit network 8 through an analog switch $AS_8$. This DC voltage $V_x$ is also inverted to $-V_x$ by an inverter 12 and then coupled via an analog switch $AS_9$ to the end $P_0$ of voltage dividing circuit network 8. Analog switches $AS_8$ and $AS_9$ are alternately enabled by the outputs Q and $\overline{Q}$ (19 KHz) of T flip-flop 5, so that a rectangular wave signal (19 KHz) having voltage levels $+V$ and $-V$ and a duty ratio of 50% is supplied to voltage dividing circuit network 8.

Values of resistors $R_1$-$R_7$ in voltage dividing circuit network 8 may be set as shown in Table I.

TABLE I

Figure 3:
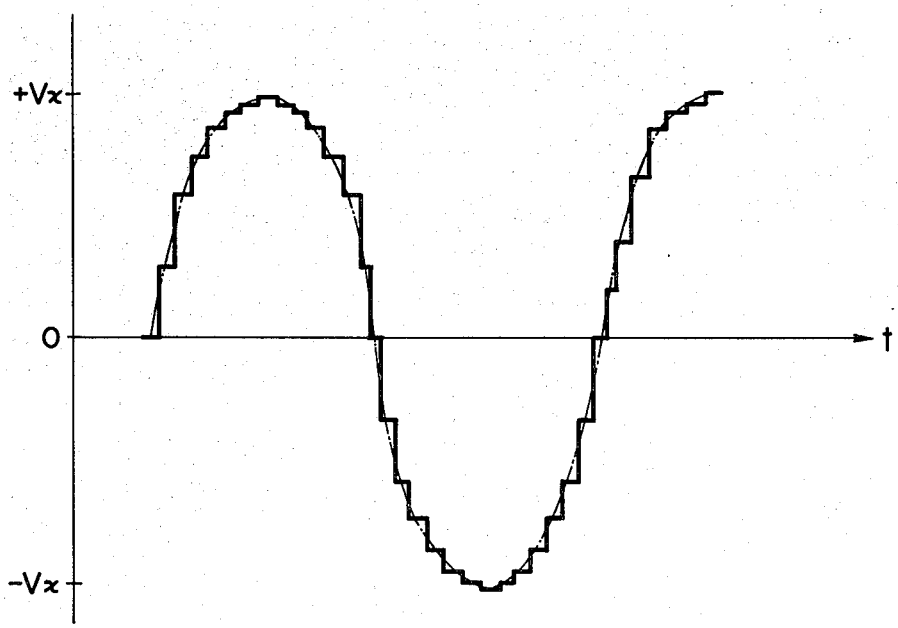
FIG. 3 shows a waveform of a sinusoidal-wavelike staircase signal appearing at the circuit point $P_8$ shown in FIG. 1.

| Resistor | $R_1$ | $R_2$ | $R_3$ | $R_4$ | $R_5$ | $R_6$ | $R_7$ |
|---|---|---|---|---|---|---|---|
| Value (ohms) | 250 | 750 | 1.2k | 1.6k | 1.9k | 2.1k | 2.2k |

Where the positive DC voltage $V_x$ is applied to voltage dividing circuit network 8 under the condition that resistors $R_1$ to $R_7$ of voltage dividing circuit network 8 has such values as shown in Table I, then a staircase wave signal having a peak-to-peak value from 0 to $V_x$, a fundamental frequency of 38 KHz, and a sinusoidal-wavelike envelope will be taken out of circuit point $P_8$. Practically, a sine-wavelike staircase signal having a peak-to-peak value from $-V_x$ to $+V_x$ and a fundamental frequency of 19 KHz is taken out of circuit point $P_8$ as shown in FIG. 3, since the rectangular wave signal having voltage levels of $+V_x$ and $-V_x$ and the fundamental frequency of 19 KHz is applied to voltage dividing circuit network 8.

This staircase wave signal is smoothed by a low-pass filter 13, which has phase inverting function, to form a sine-wave signal of 19 KHz. The gains of low-pass filters 13 and 11 are designed in such a manner that the sine-wave signal derived from low-pass filter 13 has the same amplitude as the pilot signal in the composite signal. The output of the low-pass filter 13 is opposite in phase to the pilot signal in the composite signal. The sine-wave signal from low-pass filter 13 is combined with the composite signal in an adder 14, thus allowing the pilot signal in the composite signal to be cancelled. Thus, an FM stereo composite signal from which the pilot signal has been removed is obtained at an output terminal $S_{OUT}$ and applied to an FM stereo demodulator circuit (not shown).

In the case of embodiment of the present invention as described above, the staircase wave signal of 19 KHz is formed by voltage dividing circuit network 8 to which the rectangular wave signal of 19 KHz is applied, and an analog multiplexer which includes decoder 3 and analog switches $AS_0$ to $AS_7$. Depending upon the output frequency of VCO 1 and/or the number of outputs of decoder 3, e.g. the number of resistors of voltage dividing circuit network and the number of analog switches, however, a DC voltage instead of a rectangular wave signal may be applied to the voltage dividing circuit network so as to generate a sine-wavelike staircase signal of 19 KHz.

Figure 4:
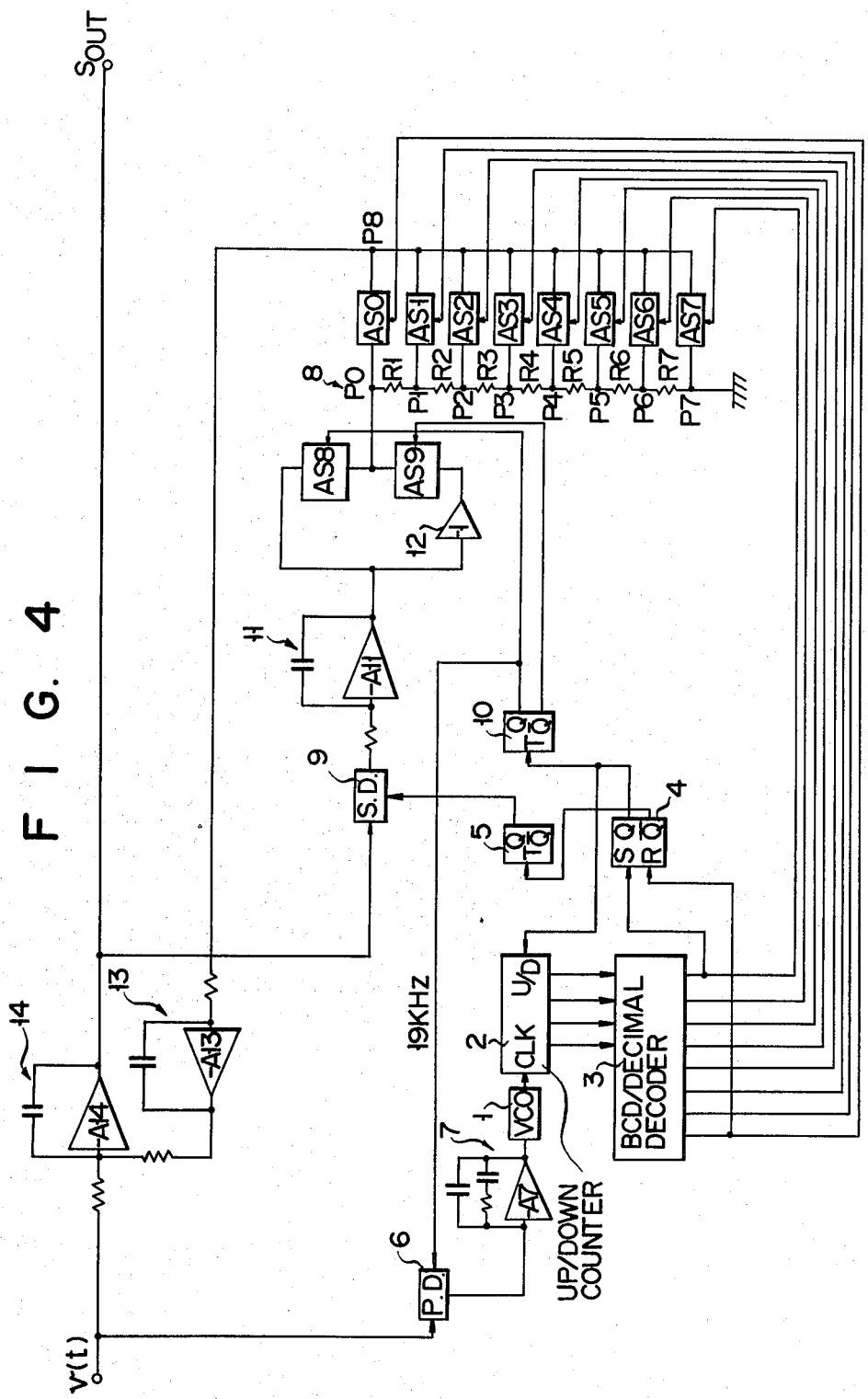
FIG. 4 shows another example of pilot signal cancelling circuit according to the present invention.

FIG. 4 shows another embodiment of the present invention, which features that an input signal of synchronous detector is taken out from the output side of adder. If arranged like this, the amplitude level of a cancel signal derived from low-pass filter 13 is NF(negative feedback)-controlled in accordance with the amplitude of residual pilot signal contained in the output signal of adder, thus enabling a reliable pilot signal cancelling operation to be achieved.

FIG. 5 shows a further embodiment of the present invention in which a stereo demodulator circuit is added to the embodiment shown in FIG. 4. The composite signal from which the pilot signal has been removed is applied to the stereo demodulator circuit, which includes a voltage dividing circuit network 20 having resistors $R_8$ to $R_{14}$, a first switch circuit 21 having analog switches $AS_{10}$ to $AS_{17}$ for coupling nodes $P_9$ to $P_{16}$ of voltage dividing circuit network 20 to a left output terminal $L_{OUT}$, and a second switch circuit 22 having analog switches $AS_{18}$ to $AS_{25}$ for coupling nodes $P_{16}$ to $P_9$ of voltage dividing circuit network 20 to a right output terminal $R_{OUT}$.

Analog switches $AS_{10}$ to $AS_{17}$ are respectively enabled by outputs "0" to "7" of decoder 3 and analog switches $AS_{25}$ to $AS_{18}$ are similarly enabled by outputs "0" to "7" of decoder 3, respectively. The scanning cycle of analog switches $AS_{10}$ to $AS_{17}$ by means of decoder 3 is therefore shifted in phase by 180 degrees from that of analog switches $AS_{25}$ to $AS_{18}$. The scanning frequency of 38 KHz is determined by the outputs of decoder 3. Resistors $R_8$ to $R_{14}$ have such values as shown in Table II. Accordingly, a signal $v(t) \cdot S(t)$ corresponding to the product of composite signal $v(t)$ from which pilot signal has been removed and a sine-wave like staircase signal $S(t)$ of 38 KHz is taken out of the left output terminal $L_{OUT}$, and signal $v(t) \cdot S(t) \angle \pi$ corresponding to the product of a sine-wavelike staircase signal $S(t) \angle \pi$ which is 180° out of phase with the signal $S(t)$ and composite signal $v(t)$ is taken out of the right output terminal $R_{OUT}$. The synchronous demodulation of FM stereo composite signal is thus achieved.

TABLE II

| Resistor | $R_8$ | $R_9$ | $R_{10}$ | $R_{11}$ | $R_{12}$ | $R_{13}$ | $R_{14}$ |
|---|---|---|---|---|---|---|---|
| Value (ohms) | 470 | 820 | 1.1k | 1.2k | 1.1k | 820 | 470 |

What is claimed is:

1. A pilot signal removing circuit for removing a pilot signal from a composite signal which contains the sine-wave pilot signal comprising:

pilot signal-to-DC voltage converting circuit means responsive to the pilot signal in the composite signal for generating a DC voltage having a magnitude proportional to the amplitude level of the pilot signal;

sine-wavelike staircase signal generating circuit means responsive to the DC voltage from said converting circuit means and the pilot signal in the composite signal for generating a sine-wavelike staircase signal in synchronism with the pilot signal, said sine-wavelike staircase signal having an amplitude proportional to the DC voltage and a fundamental frequency the same as that of the pilot signal;

smoothing circuit means connected to said sine-wavelike staircase signal generating circuit means for smoothing the sine-wavelike staircase signal to produce a sine-wave signal; and cancelling circuit means for combining the composite signal with the sine-wave signal to cancel the pilot signal from the composite signal.

2. A pilot signal removing circuit for removing a pilot signal from a composite signal which contains the sine-wave pilot signal comprising:

pilot signal-to-DC voltage converting circuit means responsive to the pilot signal in the composite signal for generating a DC voltage having a magnitude proportional to the amplitude level of the pilot signal;

a voltage dividing circuit network connected to receive the DC voltage from said converting circuit means and having a plurality of outputs;

multiplexer circuit means connected to said outputs of said voltage dividing circuit network and responsive to the pilot signal in the composite signal for reciprocatingly multiplexing output voltages at said outputs of said voltage dividing circuit network in synchronism with the pilot signal in the composite signal to produce a sine-wavelike staircase signal having a fundamental frequency the same as the frequency of the pilot signal;

smoothing circuit means for smoothing the sine-wavelike staircase signal to produce a sine-wave signal; and cancelling circuit means for combining the composite signal with the sine-wave signal to cancel the pilot signal from the composite signal.

3. A pilot signal removing circuit according to claim 1 or 2, wherein an output of said cancelling circuit is coupled to said pilot signal-to-DC voltage converting circuit means.

4. A pilot signal removing circuit for removing a pilot signal from a composite signal which contains a signal component generated by suppressed-carrier amplitude-modulating a subcarrier and the sine-wave pilot signal having a frequency half that of the subcarrier comprising:

rectangular wave signal generating means responsive to the pilot signal in the composite signal for generating a rectangular wave signal having positive and negative voltage levels proportional to the amplitude level of the pilot signal in synchronism with the pilot signal;

a voltage dividing circuit network connected to receive the rectangular wave signal and having a plurality of outputs;

multiplexer circuit means connected to said outputs of said voltage dividing circuit network and responsive to the pilot signal in the composite signal for reciprocatingly multiplexing output voltages of said voltage dividing circuit network in synchronism with the pilot signal in the composite signal to produce a sine-wavelike staircase signal having, as its fundamental frequency, the frequency of the pilot signal;

smoothing circuit means for smoothing the sine-wavelike staircase signal from said multiplexer circuit means to produce a sine-wave signal; and cancelling circuit means for combining the composite signal with the sine-wave signal from said smoothing circuit means to cancel the pilot signal from the composite signal.

5. A pilot signal removing circuit according to claim 4, wherein an output of said cancelling circuit is coupled to said rectangular wave signal generating circuit means.

* * * * *